(12) United States Patent
Okayasu

(10) Patent No.: US 8,390,268 B2
(45) Date of Patent: Mar. 5, 2013

(54) NOISE MEASUREMENT APPARATUS AND TEST APPARATUS

(75) Inventor: Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 10 days.

(21) Appl. No.: 12/642,676

(22) Filed: Dec. 18, 2009

(65) Prior Publication Data

US 2010/0148751 A1 Jun. 17, 2010

Related U.S. Application Data

(63) Continuation of application No. PCT/JP2007/062443, filed on Jun. 20, 2007.

(51) Int. Cl.
 *G01R 23/175* (2006.01)
(52) U.S. Cl. .................................................. 324/76.54
(58) Field of Classification Search .............. 324/76.52
 See application file for complete search history.

(56) References Cited

U.S. PATENT DOCUMENTS

| | | | | | |
|---|---|---|---|---|---|
| 2,700,133 | A | * | 1/1955 | Pfleger | 324/621 |
| 5,434,509 | A | * | 7/1995 | Blades | 324/536 |
| 5,563,517 | A | * | 10/1996 | Biery et al. | 324/613 |
| 5,680,420 | A | | 10/1997 | Reime | |
| 5,970,429 | A | * | 10/1999 | Martin | 702/65 |
| 6,573,636 | B1 | * | 6/2003 | Iino et al. | 310/316.01 |
| 6,781,861 | B2 | * | 8/2004 | Gomm et al. | 365/144 |
| 7,035,324 | B2 | * | 4/2006 | Mar et al. | 375/224 |
| 7,724,103 | B2 | * | 5/2010 | Feng et al. | 331/154 |
| 2003/0080724 | A1 | * | 5/2003 | Mar | 324/76.52 |
| 2005/0157829 | A1 | | 7/2005 | Aoyama et al. | |
| 2006/0221531 | A1 | | 10/2006 | Nagata | |

FOREIGN PATENT DOCUMENTS

| | | |
|---|---|---|
| EP | 0962776 A2 | 12/1999 |
| JP | 6-303157 A | 10/1994 |
| JP | 11-344510 A | 12/1999 |
| JP | 2003-142586 A | 5/2003 |
| JP | 2005-210297 A | 8/2005 |
| KR | 10-2003-0044105 A | 6/2003 |
| KR | 10-2006-0131723 A | 12/2006 |
| WO | 2005/020324 A1 | 3/2005 |

OTHER PUBLICATIONS

Nesse et al., Oscillation regularity in noise-driven excitable systems with multi-time-scale adaptation, Physical Review Letters, V. 101, p. 088101, 2008, p. 1-4.*
Pikovsky et al., Coherence resonance in a noise-driven excitable system, Phys. Rev. Ltrs., V. 78, No. 5, 1997, p. 775-778.*
Kuphaldt, Tony, Lessons in Electric Circuits, vol. III—Semiconductors, 5th ed., 2009, ibiblio.org/obp/electricCircuits, p. i-iii, 385-388.*
Korean Office Action in a counterpart application No. 10-2009-7024093, dated Apr. 19, 2011, citing Foreign Patent document Nos. 1-2 and JP H06-303157, which has been submitted in a previous IDS.
Japanese Office Action dated May 29, 2012, in a counterpart Japanese patent application No. 2009-520197.
International Search Report (ISR) issued in PCT/JP2007/062443 (patent application) for Examiner consideration, Jun. 20, 2007.
Written Option (PCT/ISA/237) issued in PCT/JP2007/062443 (patent application), Jun. 20, 2007.

* cited by examiner

*Primary Examiner* — Thomas Valone

(57) ABSTRACT

Provided is a noise measurement apparatus that measures noise at a location under measurement, comprising a self-excited oscillator that is provided at the location under measurement and that outputs an oscillation signal in which is sequentially accumulated, in each cycle, the noise at the location under measurement; a transmission path that transmits the oscillation signal output by the self-excited oscillator; and a measuring unit that measures noise added to the oscillation signal transmitted through the transmission path. The measuring unit may measure the noise at the location under measurement by differentiating noise added to the oscillation signal transmitted through the transmission path.

14 Claims, 12 Drawing Sheets ns herein to provide a noise measurement apparatus and a test apparatus, which are capable of overcoming the above drawbacks accompanying the related art. The above and other objects can be achieved by combinations described in the independent claims. The dependent claims define further advantageous and exemplary combinations of the innovations herein.

NOISE MEASUREMENT APPARATUS AND TEST APPARATUS

CROSS REFERENCE TO RELATED APPLICATION

This is a continuation application of PCT/JP2007/062443 filed on Jun. 20, 2007.

BACKGROUND

1. Technical Field

The present invention relates to a noise measurement apparatus and a test apparatus. In particular, the present invention relates to a noise measurement apparatus that measures noise at a location under measurement in a circuit substrate or the like, and to a test apparatus that tests a device under test such as a semiconductor chip.

2. Related Art

One type of testing/analysis of a device under test such as a semiconductor chip involves measuring the noise in the device under test. For example, the noise added to the output of an element under measurement can be measured by bringing a probe pin of a test apparatus into contact with the element under measurement in the device under test, as described in, for example, Japanese Patent Application No. 11-344510. Furthermore, with this method, testing/analysis of the device under test can be performed by measuring a distribution of noise across a plurality of locations under measurement in a semiconductor chip or wafer.

Along with a desire for increased accuracy when testing a semiconductor chip, there is a desire to measure weak noise occurring in the device under test. For example, it is desirable to be able to measure the weak low-frequency noise, such as 1/f noise (flicker noise), occurring due to defects or impurities in the crystalline structure of the semiconductor substrate.

It is difficult, however, to accurately measure weak noise. For example, when measuring noise with the probe pin as described above, noise also occurs in the transmission path of the probe pin. Therefore, the weak low frequency noise occurring at the location under measurement cannot be accurately separated from the transmission path noise and measured.

SUMMARY

Therefore, it is an object of an aspect of the innovations herein to provide a noise measurement apparatus and a test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary noise measurement apparatus may include a noise measurement apparatus that measures noise at a location under measurement, comprising a self-excited oscillator that is provided at the location under measurement and that outputs an oscillation signal in which is sequentially accumulated, in each cycle, the noise at the location under measurement; a transmission path that transmits the oscillation signal output by the self-excited oscillator; and a measuring unit that measures noise added to the oscillation signal transmitted through the transmission path.

According to a second aspect related to the innovations herein, one exemplary noise measurement apparatus may include a noise measurement apparatus that measures noise distribution in a circuit substrate, comprising a plurality of self-excited oscillators that are each provided at a different location under measurement in the circuit substrate, and that each output an oscillation signal in which is sequentially accumulated, in each cycle, the noise at the corresponding location under measurement; a transmission path that transmits the oscillation signal output by each self-excited oscillator; a measuring unit that measures noise added to each oscillation signal transmitted by the transmission path; and a distribution calculating section that calculates the noise distribution in the circuit substrate based on the noise in each oscillation signal measured by the measuring unit.

According to a third aspect related to the innovations herein, one exemplary noise measurement apparatus may include a noise measurement apparatus that measures noise of a device under test, comprising a transmission path that transmits an oscillation signal output by a self-excited oscillator provided at a location under measurement in the device under test; and a measuring unit that measures noise at the location under measurement by differentiating noise added to the oscillation signal transmitted through the transmission path.

According to a fourth aspect related to the innovations herein, one exemplary test apparatus may include a test apparatus that tests a device under test, comprising a noise measurement apparatus that measures noise at a predetermined location under measurement in the device under test; and a judging section that judges acceptability of the device under test based on the noise measured by the noise measurement apparatus. The noise measurement apparatus includes a self-excited oscillator that is provided at the location under measurement and outputs an oscillation signal in which is sequentially accumulated, in each cycle, the noise at the location under measurement; a transmission path that transmits the oscillation signal output by the self-excited oscillator; and a measuring unit that measures noise added to the oscillation signal transmitted by the transmission path.

According to a fifth aspect related to the innovations herein, one exemplary test apparatus may include a test apparatus that tests a device under test, comprising a noise measurement apparatus that measures noise distribution in a circuit substrate of the device under test; and a judging section that judges acceptability of the device under test based on the noise distribution measured by the noise measurement apparatus. The noise measurement apparatus includes a plurality of self-excited oscillators that are each provided at a different location under measurement in the circuit substrate, and that each output an oscillation signal in which is sequentially accumulated, in each cycle, the noise at the corresponding location under measurement; a transmission path that transmits the oscillation signal output by each self-excited oscillator; a measuring unit that measures noise added to each oscillation signal transmitted by the transmission path; and a distribution calculating section that calculates noise distribution in the circuit substrate based on the noise in each oscillation signal measured by the measuring unit.

According to a sixth aspect related to the innovations herein, one exemplary test apparatus may include a test apparatus that measures a device under test, comprising a noise measurement apparatus that measures noise at a predetermined location under measurement in the device under test; and a judging section that judges acceptability of the device under test based on the noise measured by the noise measurement apparatus. The noise measurement apparatus includes a transmission path that transmits an oscillation signal output by a self-excited oscillator provided at the location under measurement in the device under test; and a measuring unit that measures noise at the location under measurement by differentiating noise added to the oscillation signal transmitted through the transmission path.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
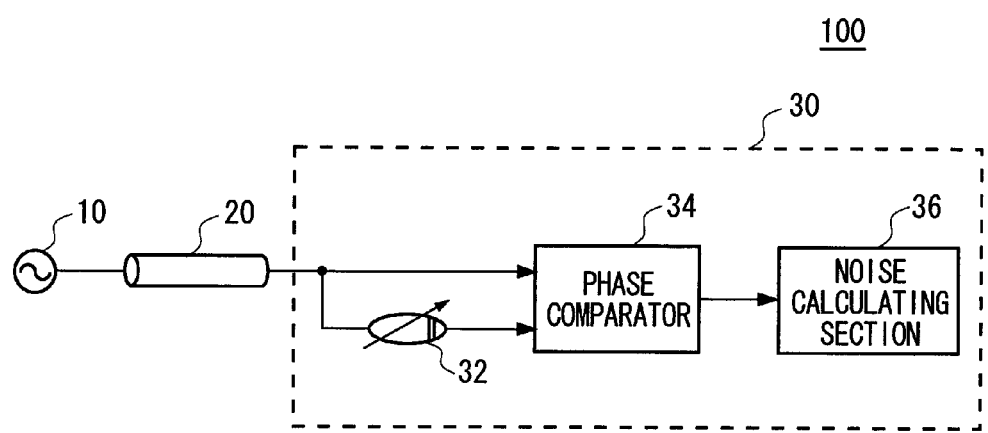
FIG. 1 shows an exemplary configuration of a noise measurement apparatus 100 according to an embodiment of the present invention.

FIG. 1 shows an exemplary configuration of a noise measurement apparatus 100 according to an embodiment of the present invention. The noise measurement apparatus 100 measures noise at a location under measurement, and includes a self-excited oscillator 10, a transmission path 20, and a measuring unit 30.

The self-excited oscillator 10 may generate a subsequent output signal based on its own output signal. For example, the self-excited oscillator 10 may feed back its own output signal to itself, and generate the subsequent output signal based on the fed-back output signal. More specifically, the self-excited oscillator 10 may be a ring oscillator, such as a VCO (Voltage Control Oscillator), an LC oscillator, or the like.

The self-excited oscillator 10 is provided at the location under measurement, where the noise is to be measured. The location under measurement may be a certain location on a circuit substrate or the like that is being measured. The oscillation signal output by the self-excited oscillator 10 is affected by (i) noise generated by the elements making up the self-excited oscillator 10 and (ii) noise generated at the location under measurement. For example, the oscillation signal generated by the self-excited oscillator 10 may include (i) noise from a power supply provided to the self-excited oscillator 10 and (ii) 1/f noise or the like caused by the elements making up the self-excited oscillator 10 and active elements provided near the location under measurement.

As described above, the self-excited oscillator 10 generates a subsequent output signal based on its own output signal. Therefore, the noise added to a certain output signal is accumulated in the subsequent output signals. For example, when the self-excited oscillator 10 performs loop oscillation, the pulse in each cycle of the output signal includes noise that is the sum of (i) the noise added to the pulse in the previous cycle and (ii) the noise added to the present cycle. In other words, the self-excited oscillator 10 integrates the noise occurring at the location under measurement according to the oscillation period.

The transmission path 20 transmits the oscillation signal output by the self-excited oscillator 10 to the measuring unit 30. The transmission path 20 may include wiring that is formed on the circuit substrate or the like. As a result of the transmission path 20 transmitting the oscillation signal, the noise of the transmission path 20 is added to the oscillation signal. For example, the oscillation signal includes white noise or the like occurring in the transmission path 20.

The measuring unit 30 measures the noise added to the oscillation signal that has been transmitted through the transmission path 20. The measuring unit 30 measures the noise occurring at the location under measurement at which the self-excited oscillator 10 is provided by differentiating the noise added to the oscillation signal transmitted through the transmission path 20. Here, differentiating the noise may involve using a process that is the inverse of the noise integration by the self-excited oscillator 10 described above. As described above, the noise integration is a process that cumulatively adds noise in each oscillation period, and therefore the noise differentiation may be a process that obtains a noise difference for each oscillation frequency.

With this process, the noise occurring at the location under measurement can be recreated and measured by the measuring unit 30. The white noise or the like due to the transmission path 20 is also differentiated by the measuring unit 30. In the manner described above, the noise differentiation process obtains a noise difference for each oscillation period, for example. Obtaining the noise difference for each oscillation period has the effect of canceling noise with a relatively high period, i.e. noise with a relatively low frequency, from the noise caused by the transmission path 20. As a result, the effect of the noise due to the transmission path 20 is decreased, enabling more accurate measurement of the noise occurring at the location under measurement.

The measuring unit 30 of the present embodiment includes a delay circuit 32, a phase comparator 34, and a noise calculating section 36. The delay circuit 32 receives the oscillation signal transmitted through the transmission path 20 after this signal is branched, and outputs a delayed signal obtained by delaying the received signal by a prescribed amount. For example, the delay circuit 32 may generate the delayed signal by delaying the received oscillation signal by an amount that is an integer multiple of the average period of the oscillation signal. The following describes a case where this integer multiple is 1.

The delay amount of the delay circuit 32 may instead be set by a user based on the design specifications or the like of the self-excited oscillator 10. As another example, the noise measurement apparatus 100 may further include a measuring section that measures the average period of the oscillation signal output by the self-excited oscillator 10 and sets the delay amount of the delay circuit 32 based on the measured value.

The phase comparator 34 detects a phase difference between the oscillation signal transmitted through the transmission path 20 and the delayed signal output by the delay circuit 32. For example, the phase comparator 34 may detect a phase difference between the edge of each pulse in the oscillation signal and the edge of each pulse in the delayed signal. Since the delay circuit 32 of the present embodiment delays the oscillation signal by an amount equal to the average period of the oscillation signal, the phase comparator 34 detects the phase difference between each pulse edge of the oscillation signal and the pulse edge of the immediately prior cycle. In this way, the measuring unit 30 can perform the differentiation process for obtaining the noise difference in each oscillation period.

The phase comparator 34 may output a voltage level corresponding to the detected phase difference. The phase comparator 34 of the present embodiment detects the phase difference for each pulse edge of the oscillation signal, and outputs a voltage signal that corresponds to the sequentially detected phase differences.

The noise calculating section 36 calculates the noise at the location under measurement based on the phase difference detected by the phase comparator 34. For example, the noise calculating section 36 may calculate the RMS value of the noise occurring at the location under measurement by obtaining the average square of the phase differences detected sequentially by the phase comparator 34. Instead, the phase comparator 34 may calculate peak-to-peak values of the phase differences detected sequentially by the phase comparator 34.

Figure 2:
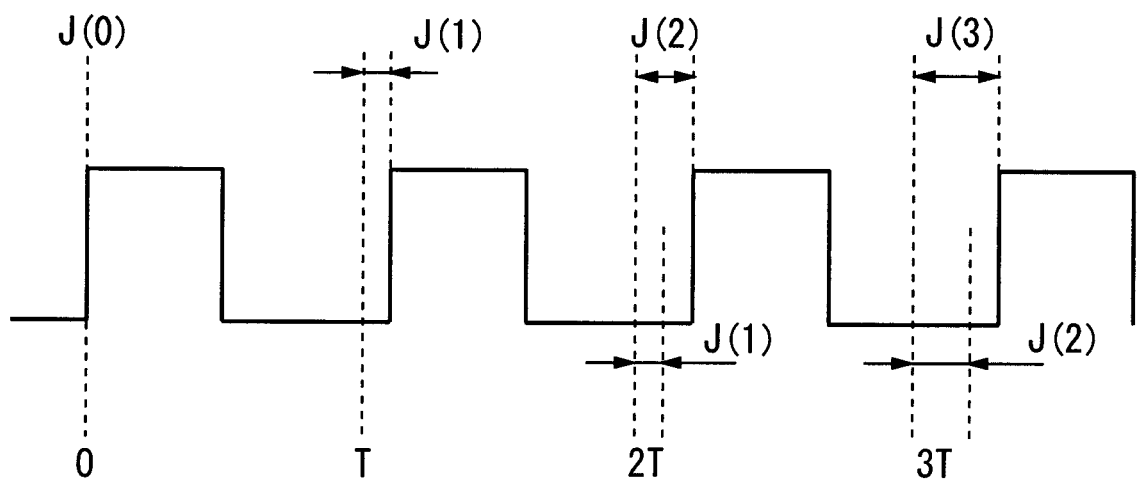
FIG. 2 shows an exemplary waveform of the oscillation signal output by the self-excited oscillator 10.

FIG. 2 shows an exemplary waveform of the oscillation signal output by the self-excited oscillator 10. The self-excited oscillator 10 of the present example generates an oscillation signal that has an average oscillation period T and to which is added noise occurring at the location under measurement. The oscillation signal ideally has edges at 0, T, 2T, 3T, etc., but due to the noise, the timing of each edge has jitter J(T) with regard to the ideal timing.

For example, the edge timing in the first cycle has an error of jitter J(1) relative to the timing T. The edge timing in the second cycle has an error of jitter J(2) relative to the timing 2T, where the jitter J(2) is obtained by adding the jitter J(1) of the previous cycle to the jitter occurring at the location under measurement. In the same way, jitter J(3) of the edge in the third cycle is obtained by adding the jitter J(2) of the previous cycle to the noise at the occurring at the location under measurement. In this way, noise occurring at the location under measurement is accumulated in the oscillation signal of the self-excited oscillator 10.

In other words, the jitter J(T) of the oscillation signal output by the self-excited oscillator 10 can be expressed as shown below.

$$J(T)=N(T)+J(T-1) \qquad \text{Expression 1}$$

Here, N(T) represents the noise occurring at the location under measurement.

In the differentiation process performed by the noise calculating section 36, the noise is differentiated for each oscillation period, that is, J(T)−J(T−1) is calculated for each oscillation period, and so the noise N(T) occurring at the location under measurement can be reproduced using Expression 1. As a result of this process, the noise occurring at the location under measurement can be measured.

Figure 3A:
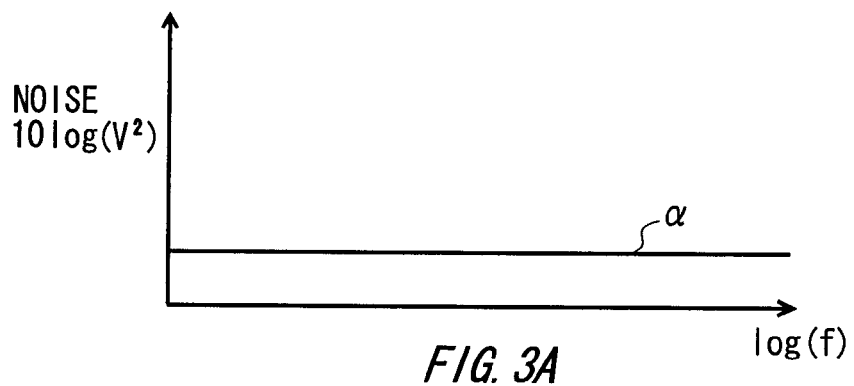
FIG. 3A shows an exemplary frequency spectrum of the noise 1/f occurring at the location under measurement and an exemplary frequency spectrum of the white noise occurring in the transmission path 20.
Figure 3B:
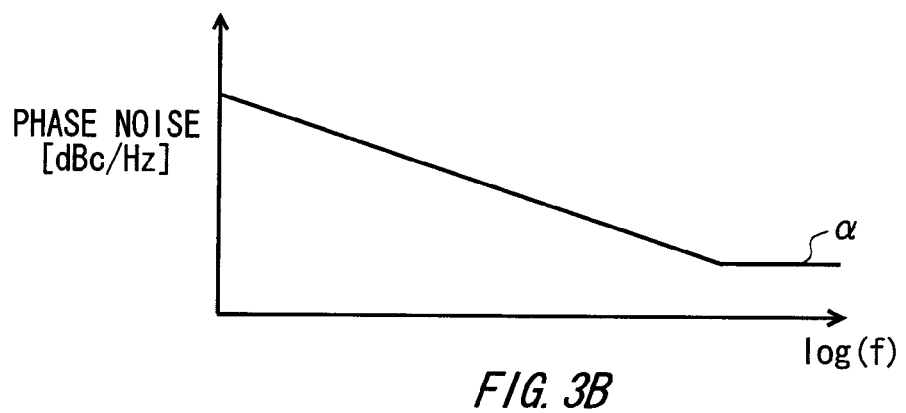
FIG. 3B shows an exemplary frequency spectrum of the noise 1/f integrated by the self-excited oscillator 10.
Figure 3C:
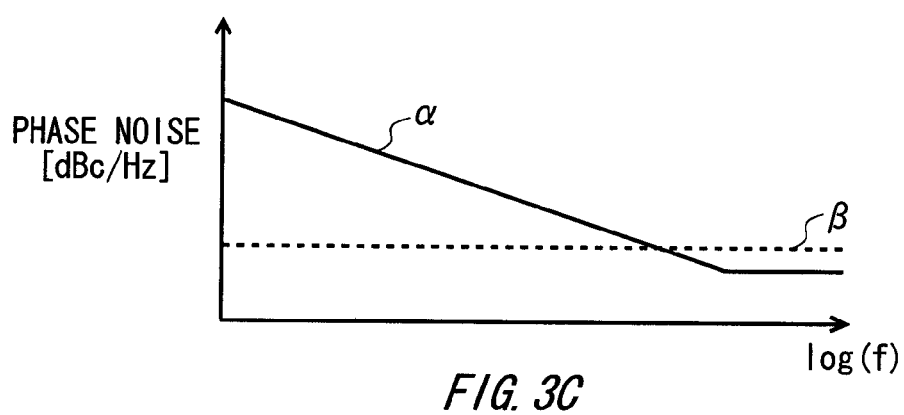
FIG. 3C shows an exemplary frequency spectrum of the phase noise differentiated by the noise calculating section 36.
Figure 3D:
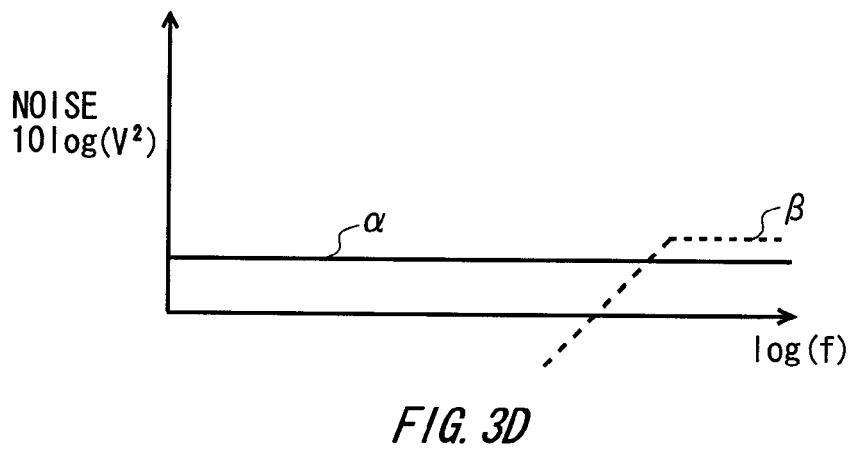
FIG. 3D shows an exemplary frequency spectrum of the signal output by the phase comparator 34.

FIGS. 3A to 3C show exemplary frequency spectra of the noise. FIG. 3A shows an exemplary frequency spectrum of noise a occurring at the location under measurement (and within the self-excited oscillator 10). The present example shows a case where the noise occurring at the location under measurement includes white noise, as shown in FIG. 3A, but not the 1/f noise. The noise shown in FIG. 3A may be a spectrum of the amplitude noise occurring at the location under measurement. In FIGS. 3A and 3D, the horizontal axis represents the logarithm of the noise frequency, and the vertical axis represents the logarithm of the noise power.

FIG. 3B shows an exemplary frequency spectrum of phase noise of the oscillation signal output by the self-excited oscillator 10. The carrier frequency of the oscillation signal and the component near the harmonic component thereof in the noise shown in FIG. 3A are converted into the phase noise of the oscillation signal. For ease of explanation, the following does not take into consideration the noise component converted from the component near the harmonic component.

As described above, the noise a occurring at the location under measurement is integrated by the self-excited oscillator 10 and measured as the phase noise of the oscillation signal. Therefore, the phase noise of the oscillation signal has integration characteristics as shown in FIG. 3B. For example, the spectrum of the integrated noise a has a slope of −20 dB/dec within a prescribed frequency range. In FIGS. 3B and 3C, the horizontal axis represents the logarithm of an offset frequency of the noise relative to the carrier frequency of the oscillation signal, and the vertical axis represents a power ratio between the carrier frequency component and the noise component at each frequency.

FIG. 3C shows an exemplary frequency spectrum of the phase noise of the oscillation signal input to the measuring unit 30. As described above, the oscillation signal input to the measuring unit 30 includes the phase noise shown in FIG. 3B and also phase noise β caused by the transmission path 20. The phase noise β caused by the transmission path 20 may be the white noise shown in FIG. 3C.

FIG. 3D shows an exemplary frequency spectrum of the signal output by the phase comparator 34. The phase comparator 34 may output a voltage signal corresponding to the detected phase difference. As described above, the phase difference detected by the phase comparator 34 corresponds to the result of the differentiation of the phase noise of the oscillation signal input to the measuring unit 30. As a result, the integration characteristic of the noise a shown in FIG. 3B is cancelled out. Therefore, the spectrum of the noise α is substantially the same as the spectrum of the noise occurring at the location under measurement shown in FIG. 3A. Furthermore, the spectrum of the phase noise β caused by the transmission path 20 is suppressed by the differentiation process.

The process described above can decrease the effect of the phase noise β caused by the transmission path 20, and thereby enable accurate measurement of the phase noise a occurring at the location under measurement. Furthermore, the noise calculating section 36 may calculate the phase noise at the location under measurement after extracting, from the phase difference detected by the phase comparator 34, frequency components that are less than a prescribed reference frequency. The reference frequency may be selected such that the level of a frequency component lower than the reference frequency becomes less than a prescribed value when the noise caused by the transmission path 20 is differentiated.

Figure 4A:
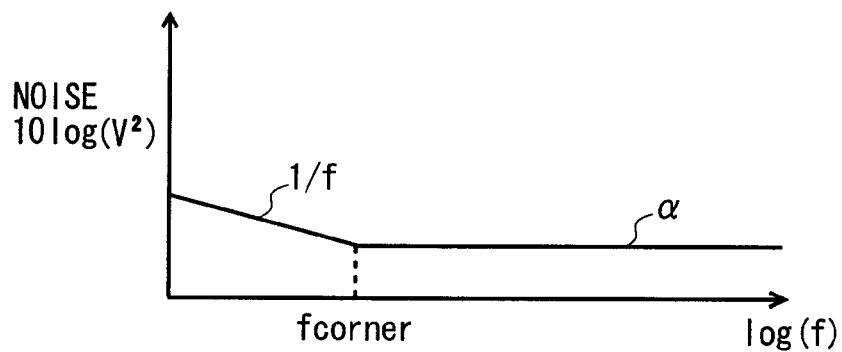
FIG. 4A shows an exemplary frequency spectrum of noise a occurring at the location under measurement and within the self-excited oscillator 10.

FIGS. 4A to 4D show exemplary examples of other frequency spectra of the noise. FIG. 4A shows an exemplary frequency spectrum of noise a occurring at the location under measurement (and within the self-excited oscillator 10). The present example shows a case where the noise occurring at the location under measurement includes both white noise and the 1/f noise. The horizontal and vertical axes in FIGS. 4A to 4D represent the same values as the horizontal and vertical axes in FIGS. 3A to 3D. The corner frequency fcorner in FIGS. 4A to 4D may be the frequency at which the spectrum waveform of the 1/f noise dependent on frequency rises. The 1/f noise component has a slope of −10 dB/dec, for example, within a frequency range that does not extend higher than the corner frequency.

Figure 4B:
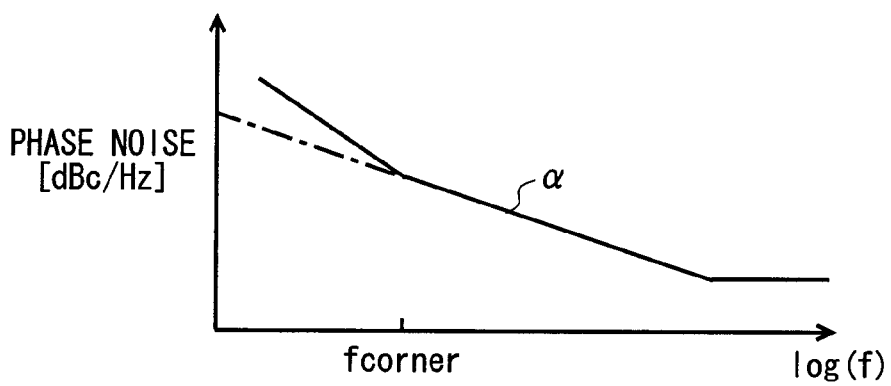
FIG. 4B shows an exemplary frequency spectrum of phase noise of the oscillation signal output by the self-excited oscillator 10 and having the noise shown in FIG. 4A.

FIG. 4B shows an exemplary frequency spectrum of phase noise of the oscillation signal output by the self-excited oscillator 10 and having the noise shown in FIG. 4A. As described in FIG. 3B, the noise a occurring at the location under measurement is integrated by the self-excited oscillator 10. Therefore, the spectrum of the integrated noise a has a slope of −30 dB/dec, for example, within the frequency range below the corner frequency. The spectrum of the integrated noise a has a slope of −20 dB/dec, for example, within the frequency range above the corner frequency.

Figure 4C:
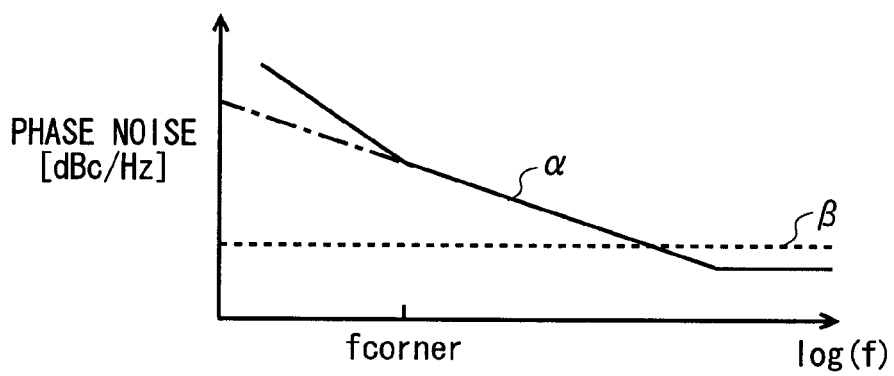
FIG. 4C shows an exemplary frequency spectrum of the phase noise of the oscillation signal input to the measuring unit 30.

FIG. 4C shows an exemplary frequency spectrum of the phase noise of the oscillation signal input to the measuring unit 30. The oscillation signal input to the measuring unit 30 includes the phase noise shown in FIG. 4B and also phase noise β caused by the transmission path 20. The phase noise β caused by the transmission path 20 may be the white noise shown in FIG. 4C.

Figure 4D:
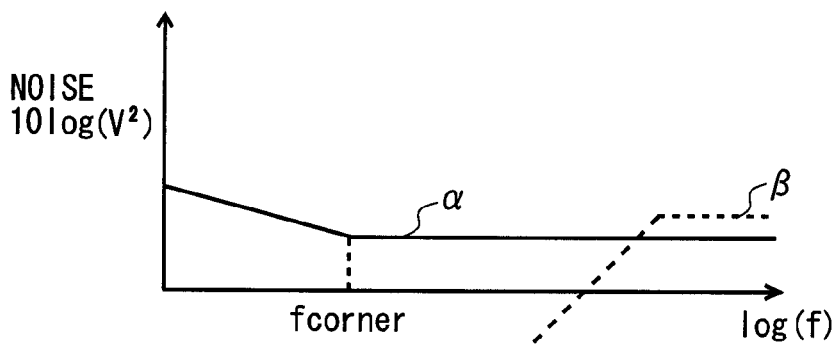
FIG. 4D shows an exemplary frequency spectrum of the signal output by the phase comparator 34.

FIG. 4D shows an exemplary frequency spectrum of the signal output by the phase comparator 34. As described above, the phase difference detected by the phase comparator 34 corresponds to the result of the differentiation of the phase noise of the oscillation signal input to the measuring unit 30. As a result, the integration characteristic, i.e. the slope of −20 dB/dec, of the noise a shown in FIG. 4B is cancelled out. Therefore, the spectrum of the noise α is substantially the same as the spectrum of the noise occurring at the location under measurement shown in FIG. 4A. Furthermore, the spectrum of the phase noise β caused by the transmission path 20 is suppressed by the differentiation process.

The process described above can decrease the effect of the phase noise β caused by the transmission path 20, and thereby enable accurate measurement of the phase noise α, which includes the 1/f noise, occurring at the location under measurement. For example, with this differentiation process, the spectrum of the noise β is almost unobservable in the frequency range below the corner frequency. Therefore, the weak 1/f noise can be accurately observed in a region below the corner frequency. Furthermore, the noise calculating section 36 may calculate the 1/f noise at the location under measurement after extracting, from the phase difference detected by the phase comparator 34, a frequency component that is less than the corner frequency.

Figure 5:
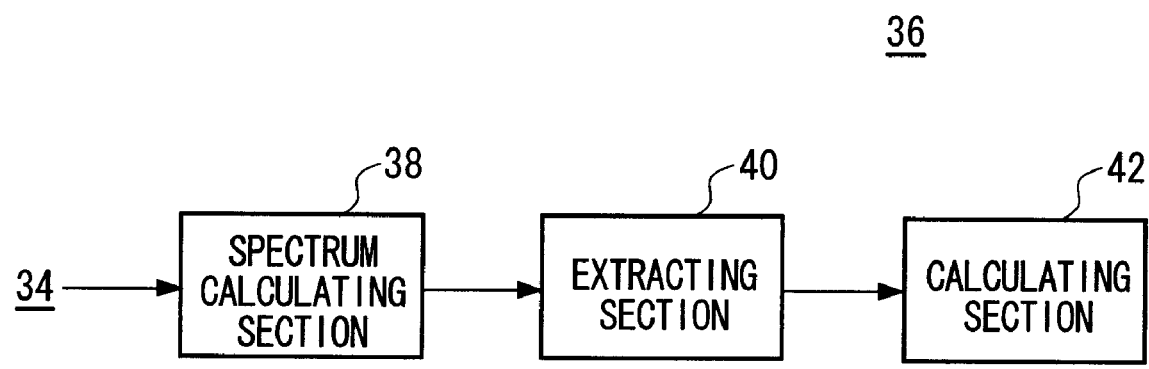
FIG. 5 shows an exemplary configuration of the noise calculating section 36.

FIG. 5 shows an exemplary configuration of the noise calculating section 36. The noise calculating section 36 includes a spectrum calculating section 38, an extracting section 40, and a calculating section 42. The spectrum calculating section 38 calculates the frequency spectrum of the noise detected by the phase comparator 34, based on the phase difference detected by the phase comparator 34 for each cycle of the oscillation signal. For example, the spectrum calculating section 38 may calculate the frequency spectrum by performing a discrete Fourier transform on the value of the phase difference detected by the phase comparator 34 for each edge of the oscillation signal.

The extracting section 40 extracts a frequency component that is less than a predetermined frequency from the frequency spectrum extracted by the extracting section 40. This frequency is the reference frequency described above. The calculating section 42 calculates the noise at the location under measurement based on the frequency spectrum component extracted by the extracting section 40. For example, the calculating section 42 may calculate a temporal waveform of the noise occurring at the location under measurement by performing an inverse Fourier transform on the frequency spectrum component extracted by the extracting section 40. The extracting section 40 may calculate the RMS value, the maximum value, the minimum value, the difference between the maximum and minimum value, or the like of the noise occurring at the location under measurement, based on the calculated temporal waveform.

Instead of the spectrum calculating section 38 and the extracting section 40, the noise calculating section 36 may include a filter that passes a frequency component, from the voltage signal output by the phase comparator 34, that is less than the reference frequency, e.g. the corner frequency, and supplies the passed frequency component to the calculating section 42. With this configuration, the 1/f noise can be accurately measured at the location under measurement.

Figure 6:
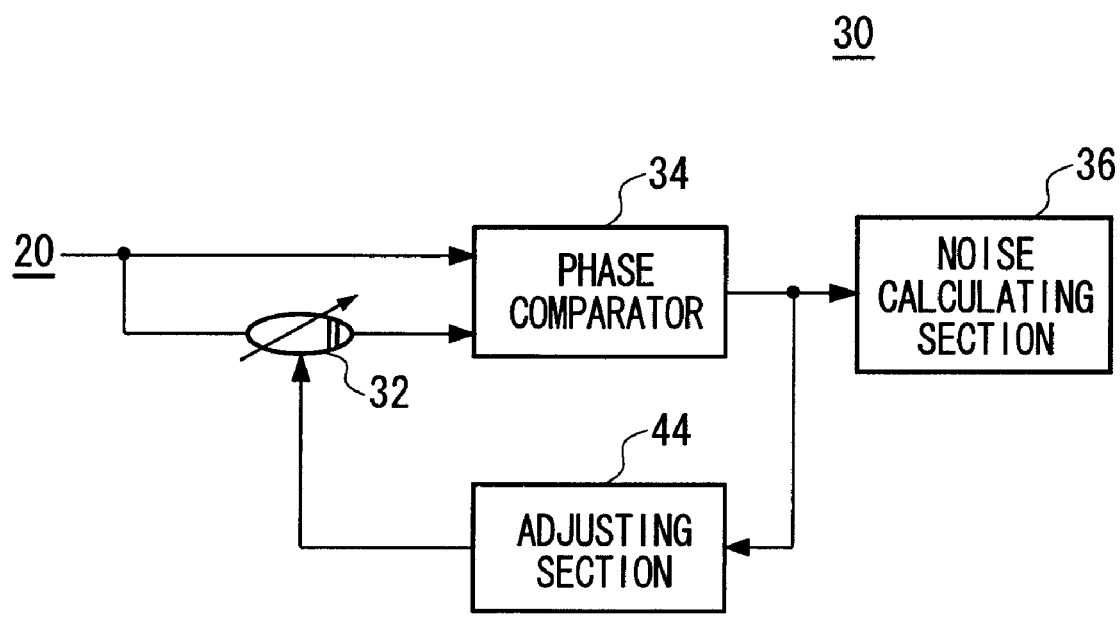
FIG. 6 shows another exemplary configuration of the measuring unit 30.

FIG. 6 shows another exemplary configuration of the measuring unit 30. The measuring unit 30 of the present example includes an adjusting section 44 in addition to the configuration of the measuring unit 30 described in relation to FIGS. 1 to 5. Other configurational elements may be the same as those described in FIG. 1.

Figure 7:
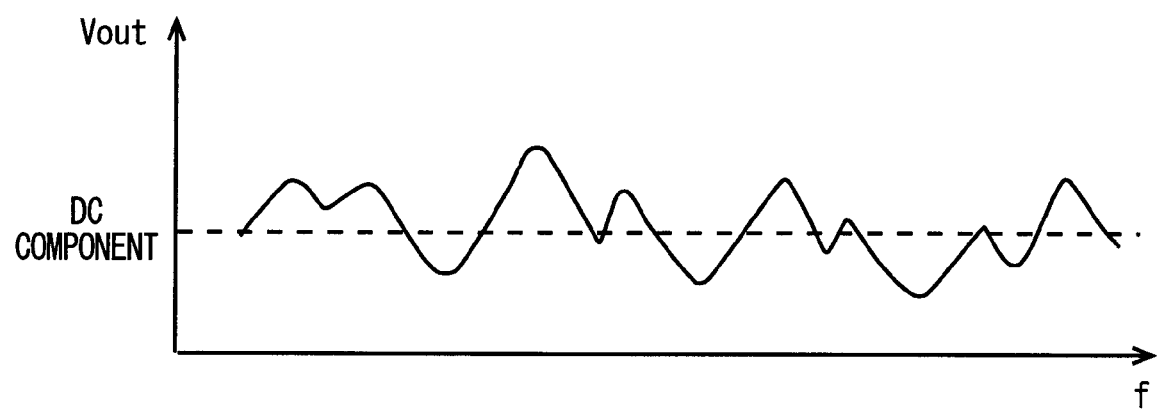
FIG. 7 shows an exemplary waveform of the voltage signal output by the phase comparator 34.

FIG. 7 shows an exemplary waveform of the voltage signal output by the phase comparator 34. The adjusting section 44 adjusts the delay amount of the delay circuit 32 based on the phase difference output by the phase comparator 34, such that the DC component of the phase difference output by the phase comparator 34 is substantially zero.

For example, the adjusting section 44 calculates, for each predetermined duration, an average value of the phase difference output by the phase comparator 34 within the predetermined duration, and adjusts the delay amount of the delay circuit 32 such that this average value becomes substantially zero. With this configuration, the adjusting section 44 can accurately set the delay amount of the delay circuit 32 to be an integer multiple of the period of the oscillation signal.

Figure 8:
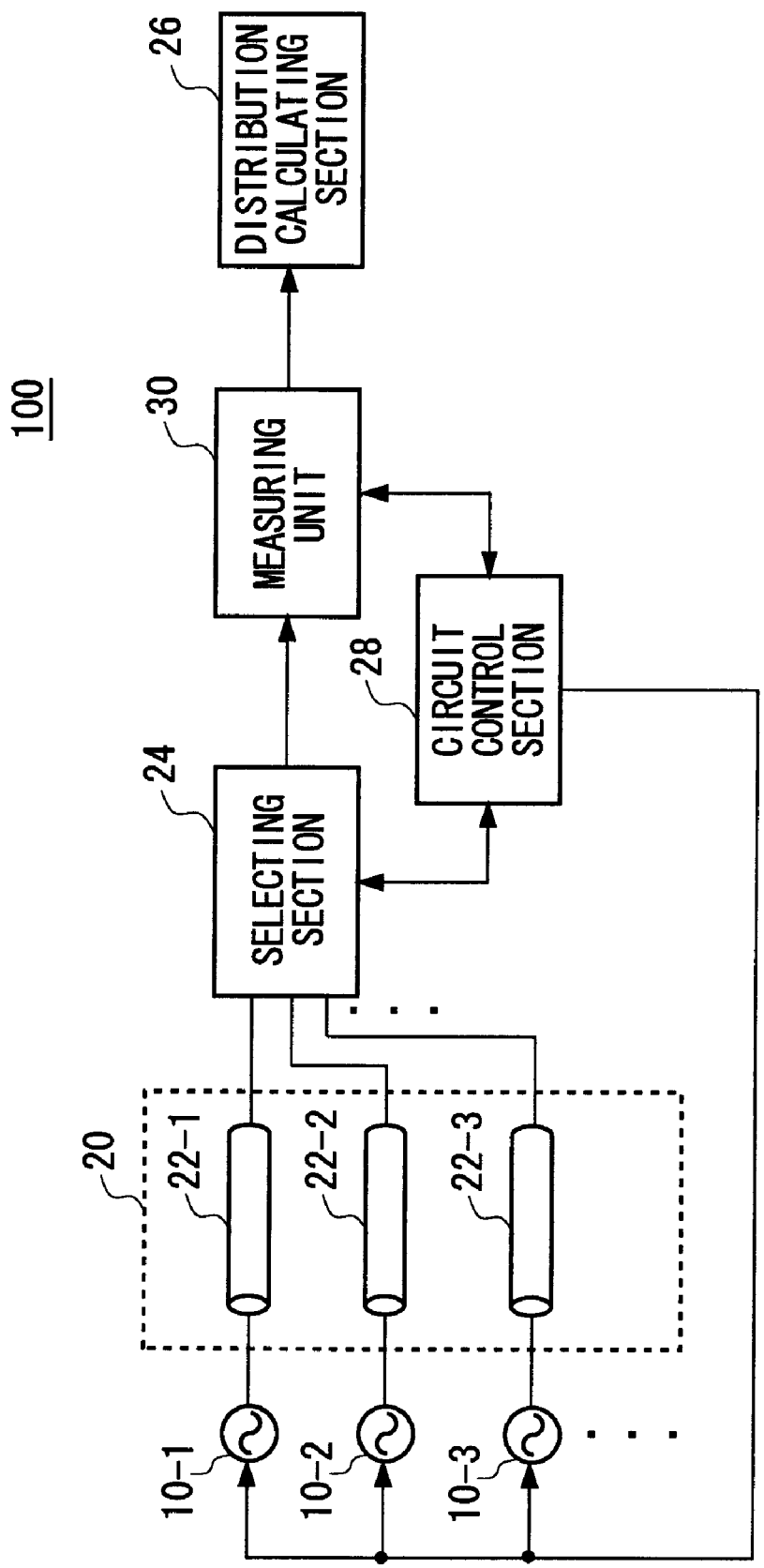
FIG. 8 shows another exemplary configuration of the noise measurement apparatus 100.

FIG. 8 shows another exemplary configuration of the noise measurement apparatus 100. The noise measurement apparatus 100 of the present example includes a plurality of the self-excited oscillators 10, the transmission path 20, a selecting section 24, the measuring unit 30, a distribution calculating section 26, and a circuit control section 28. Each self-excited oscillator 10 may be the same as the self-excited oscillator 10 described in relation to FIGS. 1 to 7. Each self-excited oscillator 10 is provided on the same circuit substrate at different locations under measurement.

The transmission path 20 transmits the oscillation signal output by each self-excited oscillator 10. The transmission path 20 of the present embodiment includes a plurality of individual wirings 22. The individual wirings 22 are provided to correspond one-to-one with the self-excited oscillators 10, and each individual wiring 22 transmits the oscillation signal output by the corresponding self-excited oscillator 10. Each individual wiring 22 may be the same as the transmission path 20 described in relation to FIGS. 1 to 7.

The selecting section 24 receives the oscillation signals transmitted through the individual wirings 22, and sequentially selects the oscillation signals to be input to the measuring unit 30. The selecting section 24 may include a plurality of input ports corresponding one-to-one with the plurality of individual wirings 22, for example. This selecting section 24 sequentially selects the oscillation signals input to the input ports according to a control signal from the circuit control section 28, and supplies the measuring unit 30 with the selected oscillation signals.

The measuring unit 30 measures the noise added to each of the oscillation signals transmitted through an individual wiring 22. The measuring unit 30 may be the same as the measuring unit 30 described in FIGS. 1 to 7. It should be noted that the delay circuit 32 of the measuring unit 30 receives the branched oscillation signal from the selecting section 24, and outputs a delayed signal obtained by delaying this oscillation signal by a prescribed amount. The phase comparator 34 detects the phase difference between the oscillation signal received from the selecting section 24 and the delayed signal output by the delay circuit 32. The noise calculating section 36 calculates the noise at the location under measurement selected by the selecting section 24, based on the phase difference detected by the phase comparator 34.

The measuring unit 30 may sequentially measure the noise of the oscillation signals sequentially supplied from the selecting section 24. The measuring unit 30 may notify the circuit control section 28 when measurement of one oscillation signal has been completed. Upon receiving this notification, the circuit control section 28 may cause the selecting section 24 to select the next oscillation signal to be measured. With this process, the noise measurement apparatus 100 may repeat the measurement until all of the oscillation signals have been measured.

The distribution calculating section 26 calculates the noise distribution of the circuit substrate being measured based on the noise at each of the locations under measurement measured by the measuring unit 30. For example, the distribution calculating section 26 may calculate a noise distribution in which the RMS value of the noised measured by the measuring unit 30 is associated with the respective location under measurement. The measuring unit 30 may supply the distribution calculating section 26 with each measured value in association with information of the corresponding location under measurement. The circuit control section 28 may notify the measuring unit 30 concerning which location under measurement the oscillation signal received by the measuring unit 30 corresponds to.

The circuit control section 28 may stop the oscillation by the self-excited oscillators 10 that do not output the oscillation signal selected by the selecting section 24. By stopping the oscillation, the effect of the noise due to other self-excited oscillators 10 can be eliminated from the oscillation signal output by the self-excited oscillator 10 whose oscillation signal is selected.

Figure 9:
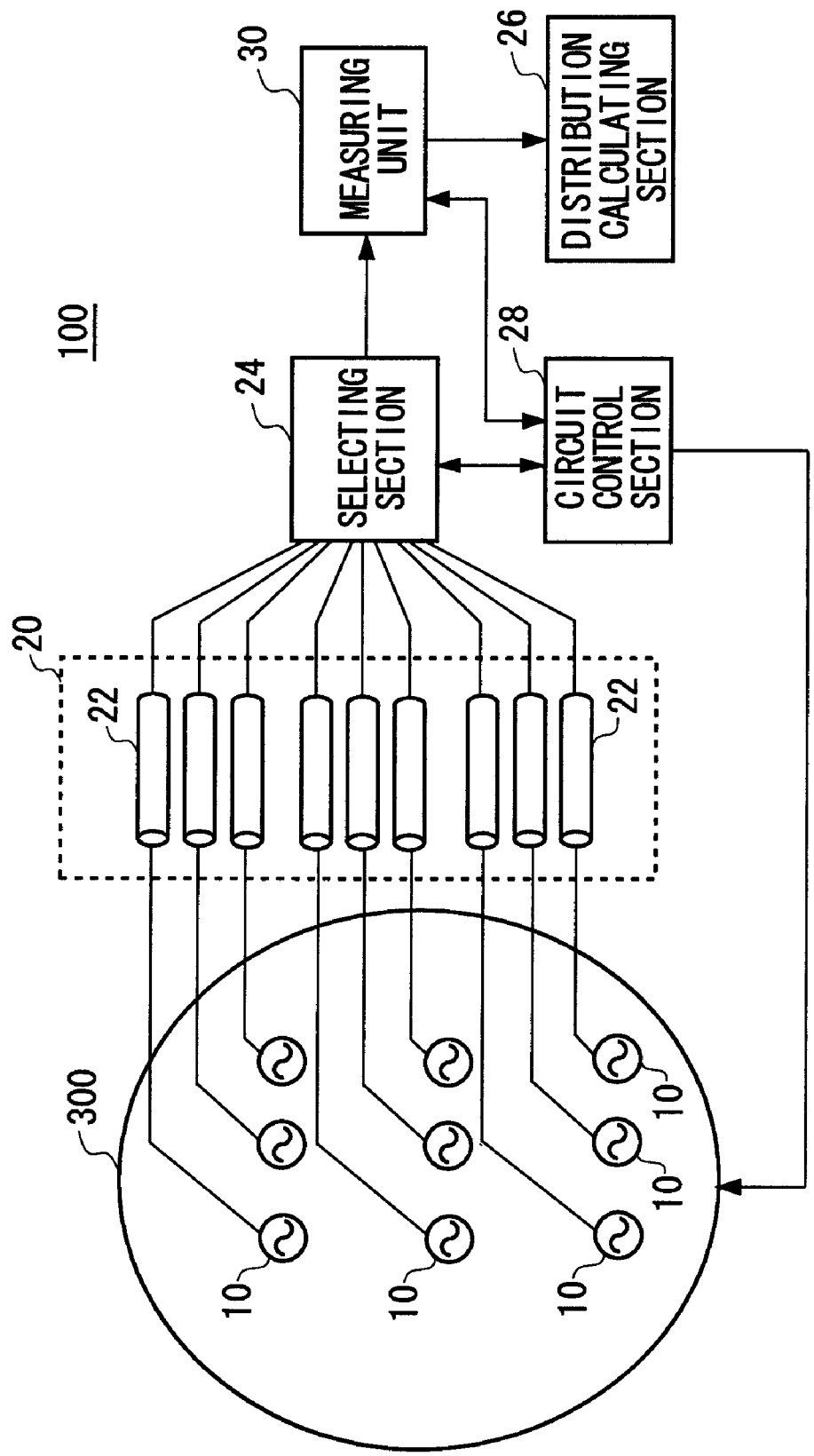
FIG. 9 shows an exemplary usage of the noise measurement apparatus 100 shown in FIG. 8.

FIG. 9 shows an exemplary usage of the noise measurement apparatus 100 shown in FIG. 8. The noise measurement apparatus 100 of the present example includes a self-excited oscillator 10 at each of a plurality of locations under measurement on a semiconductor wafer 300, which is an example of the circuit substrate. With this configuration, the noise measurement apparatus 100 can accurately measure the distribution of noise occurring in the semiconductor wafer 300. All or a portion of the transmission path 20, the selecting section 24, the circuit control section 28, the measuring unit 30, and the distribution calculating section 26 are formed on the semiconductor wafer 300. For example, the selecting section 24 may be formed on the semiconductor wafer 300, while the measuring unit 30, the circuit control section 28, and the distribution calculating section 26 are formed outside of the semiconductor wafer 300.

Figure 10:
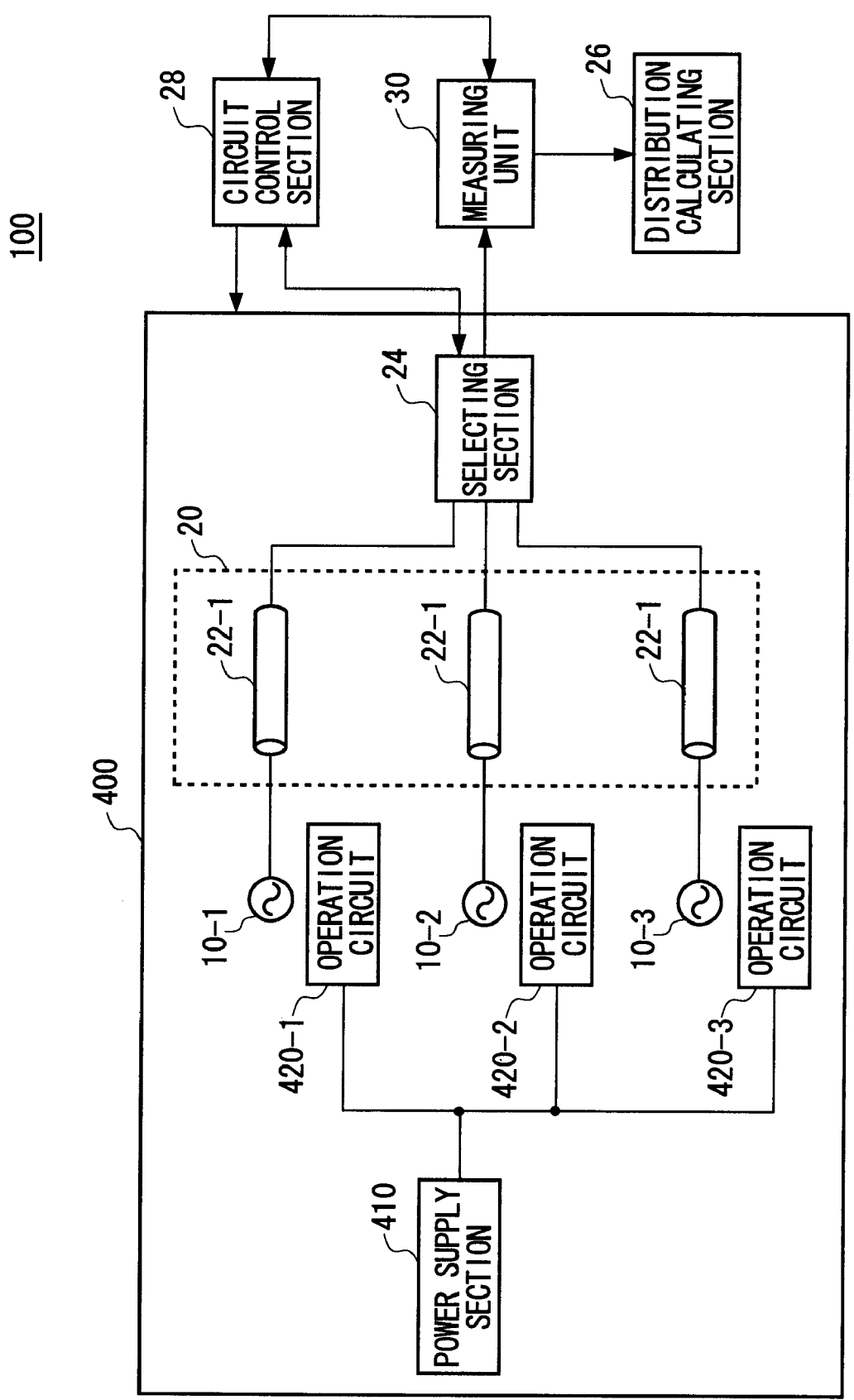
FIG. 10 shows another exemplary usage of the noise measurement apparatus 100 shown in FIG. 8.

FIG. 10 shows another exemplary usage of the noise measurement apparatus 100 shown in FIG. 8. The noise measurement apparatus 100 of the present example includes a self-excited oscillator 10 at each of a plurality of locations under measurement on a semiconductor chip 400, which is an example of the circuit substrate. In this example, the selecting section 24 is provided on the semiconductor chip 400. With this configuration, the noise measurement apparatus 100 can accurately measure the distribution of noise occurring in the semiconductor chip 400.

The semiconductor chip 400 includes a power supply section 410 and a plurality of operation circuits 420. The operation circuits 420 may operate when the semiconductor chip 400 is implemented. The operation circuits 420 may be digital circuits such as computational circuits or analog circuits such as oscillation circuits, for example. The power supply section 410 supplies each of the operation circuits 420 with supply power.

The plurality of self-excited oscillators 10 are provided to correspond one-to-one with the plurality of operation circuits 420. Each self-excited oscillator 10 is provided at a location under measurement according to the corresponding operation circuit 420. For example, each self-excited oscillator 10 may be provided at a location that is close enough to the corresponding operation circuit 420 that jitter is added to the oscillation signal by the noise occurring in the operation circuit 420. Furthermore, each self-excited oscillator 10 may be provided near the corresponding operation circuit 420 such that the jitter caused by the noise from the corresponding operation circuit 420 is greater, by a prescribed ratio, than the jitter caused by the noise from the other operation circuits 420.

As described above, the circuit control section 28 may stop the oscillation by the self-excited oscillators 10 that are not selected by the selecting section 24. The circuit control section 28 may further control whether the power supply section 410 and the operation circuits 420 operate. With this control, the noise measurement apparatus 100 can measure the noise at each location under measurement for each operational state of the circuit substrate.

For example, when measuring the 1/f noise component in the noise at the location under measurement, the circuit control section 28 may cause the measuring unit 30 to measure the noise after stopping operation of the power supply section 410 and the operation circuits 420. In this case, the 1/f noise or the like caused by the crystalline configuration or the like of the location under measurement at which the self-excited oscillator 10 is provided is added to the oscillation signal of the self-excited oscillator 10, and the effect of noise from other circuits is decreased. As described in FIGS. 3A to 3D, by using the measuring unit 30 to extract a frequency component less than the reference frequency and then performing the measurement, the noise measurement apparatus 100 can accurately measure the 1/f noise component.

When measuring a noise component that does not depend on frequency from among the noise at the location under measurement, the circuit control section 28 may cause the measuring unit 30 to measure the noise after causing the power supply section 410 and the operation circuits 420 to operate. In this case, the 1/f noise described above and also the noise from other circuits are added to the oscillation signal of the self-excited oscillator 10. By subtracting (i) the frequency spectrum of the 1/f noise measured using the above method from (ii) the frequency spectrum of the noise measured according to the received oscillation signal, the measuring unit 30 can measure the noise component that does not depend on frequency from among the noise at the location under measurement.

Figure 11:
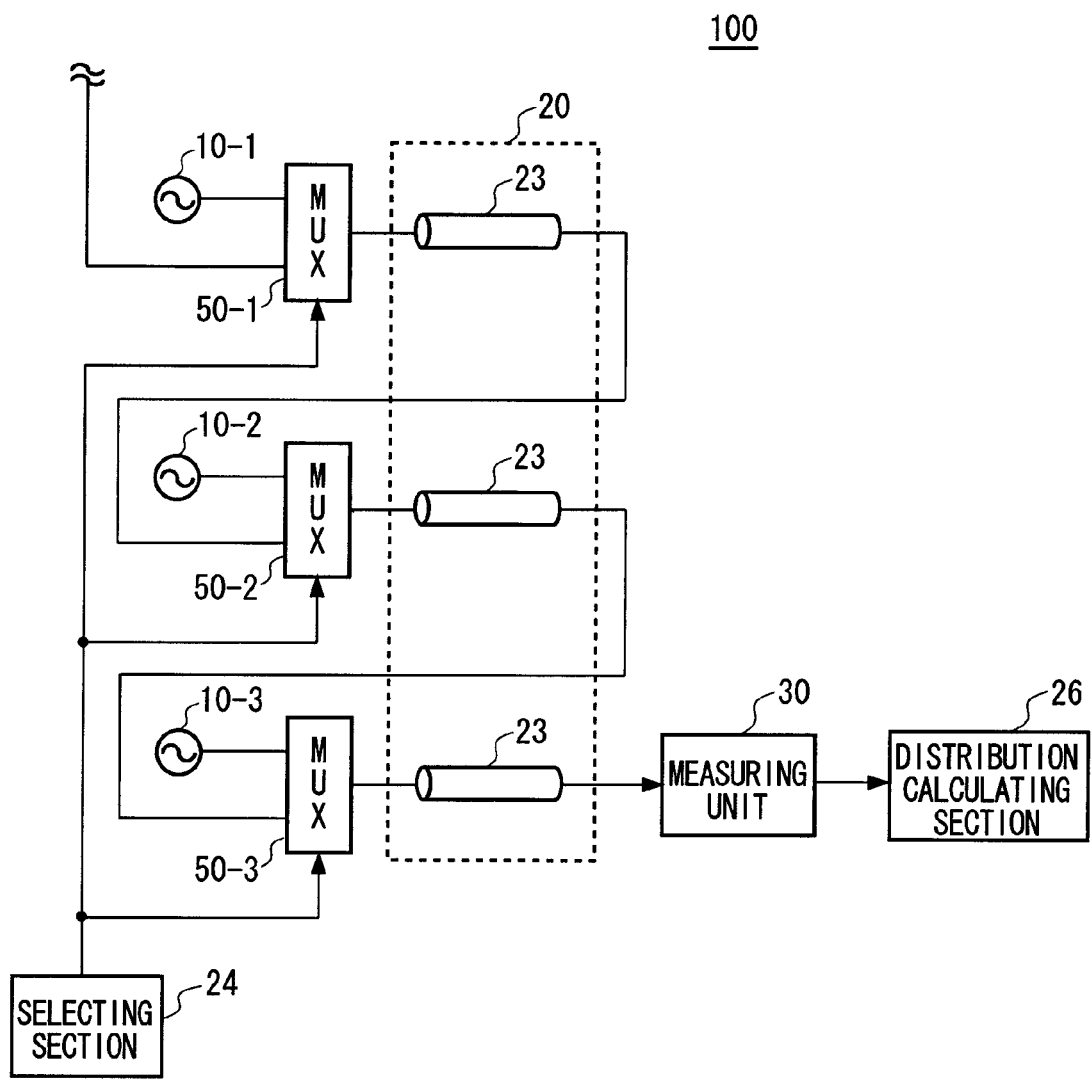
FIG. 11 shows another exemplary configuration of the noise measurement apparatus 100.

FIG. 11 shows another exemplary configuration of the noise measurement apparatus 100. The noise measurement apparatus 100 of the present example further includes a plurality of individual switching sections 50 in addition to the configuration of the noise measurement apparatus 100 described in FIGS. 8 to 10, and also differs by having the plurality of self-excited oscillators 10 connected in series by the transmission path 20. Aside from these differences, the noise measurement apparatus 100 of the present example has the same configuration as the noise measurement apparatus 100 described in FIGS. 8 to 10. FIG. 11 does not show the circuit control section 28, but the circuit control section 28 may be included in the noise measurement apparatus 100 if desired.

The transmission path 20 includes serial wiring 23 that connects the plurality of self-excited oscillators 10 in series with the measuring unit 30. The serial wiring 23 is provided between each of the self-excited oscillators 10 to be connected.

The plurality of individual switching sections 50 are provided to correspond one-to-one with the plurality of self-excited oscillators 10. Each individual switching section 50 receives the output of the self-excited oscillator 10 at the previous stage and the output of the corresponding self-excited oscillator 10, and switches which of these outputs is passed as the output of the present stage.

The selecting section 24 selects which self-excited oscillator's 10 oscillation signal to input to the measuring unit 30 by controlling the individual switching sections 50. For example, the selecting section 24 selects a certain individual switching section 50, causes selected individual switching section 50 to pass the output of the corresponding self-excited oscillator 10, and causes the other individual switching sections 50 to pass the output of the self-excited oscillator 10 of the previous stage. With this control, the oscillation signal generated by the selected self-excited oscillator 10 can be input to the measuring unit 30. The selecting section 24 sequentially selects the oscillation signals output by the self-excited oscillators 10 by sequentially changing the selected individual switching section 50, and inputs the sequentially selected oscillation signals to the measuring unit 30.

The self-excited oscillators 10 described in FIGS. 1 to 11 need not operate during actual operation of the circuit substrate. In other words, the self-excited oscillators 10 may be provided to measure the noise in the circuit substrate. Instead, the self-excited oscillators 10 may operate during actual operation of the self-excited oscillator 10. In this case, the circuit substrate may include a transmission path that transmits the output of the self-excited oscillator 10 to the measuring unit 30 while the noise is being measured.

The noise measurement apparatuses 100 described in FIGS. 1 to 11 include one or more self-excited oscillators 10, but as another example, the circuit substrate being measured may include the self-excited oscillators 10, so that the noise measurement apparatus 100 need not include the self-excited oscillators 10. In this case, the noise measurement apparatus 100 may include a transmission path that transmits the output of the self-excited oscillator 10 of the circuit substrate to the measuring unit 30.

Figure 12:
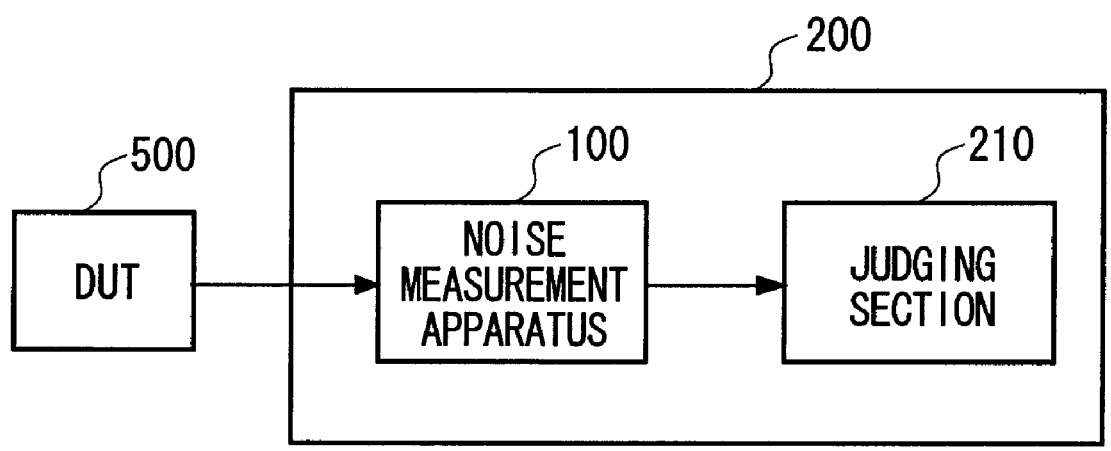
FIG. 12 shows an exemplary configuration of a test apparatus 200 according to an embodiment of the present invention.

FIG. 12 shows an exemplary configuration of a test apparatus 200 according to an embodiment of the present invention. The test apparatus 200 tests a device under test 500 such as a semiconductor chip or a semiconductor wafer, and includes the noise measurement apparatus 100 and a judging section 210.

The noise measurement apparatus 100 may be any one of the noise measurement apparatuses 100 described in FIGS. 1 to 11. The judging section 210 judges acceptability of the device under test 500 based on the measurement result of the noise measurement apparatus 100.

For example, if the noise measurement apparatus 100 measures the noise at a predetermined location under measurement in the device under test 500, the judging section 210 may judge the acceptability of the device under test 500 based on whether the RMS value or the like of the noise measured by the noise measurement apparatus 100 is within a prescribed range.

If the noise measurement apparatus 100 measures the noise distribution in the circuit substrate of the device under test 500, the judging section 210 judges the acceptability of the device under test 500 based on the noise distribution measured by the noise measurement apparatus 100. For example, the judging section 210 may judge the acceptability of the device under test 500 based on whether the value of each point of noise in the noise distribution is within a prescribed range. Instead, the judging section 210 may judge the acceptability of the device under test 500 based on whether a degree of variation, standard deviation, or the like of the noise distribution is within a prescribed range. As described above, the noise measurement apparatus 100 can accurately measure the noise. Therefore, the test apparatus 200 can accurately judge the acceptability of the device under test 500.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

As described above, the embodiments of the present invention can decrease the effect of noise occurring in a transmission path of a measurement system. Therefore, the embodiments can accurately measure weak noise at the location under measurement. Furthermore, the embodiments can accurately measure a noise distribution across a plurality of locations under measurement.

Furthermore, the noise being measured can be converted into fluctuation of the oscillation period, e.g. jitter or phase noise in the oscillation signal, by the self-excited oscillator 10. In other words, information concerning the noise being measured can be converted into timing information of the oscillation signal. The measuring unit 30 can then obtain the noise by measuring the timing information of the oscillation signal. Therefore, the noise can be measured as long as the oscillation signal transmitted to the measuring unit 30 depends on the timing information, and the analog waveform information need not be transmitted.

Accordingly, the transmission path 20, the selecting section 24, the individual switching section 50, and the like that perform the transmission and selection of the oscillation signal may use digital circuits such as logic circuits. As a result, a simple circuit can be used to decrease the effect of transmission distortion and voltage error in the transmission path 20, and to measure the noise at the location under measurement.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A noise measurement apparatus comprising:
   a self-excited oscillator that is provided at a location under measurement in a circuit substrate, semiconductor chip, or wafer and that outputs an oscillation signal in which is sequentially accumulated, in each oscillation period, a first noise occurring at the location under measurement;
   a transmission path that transmits the oscillation signal output by the self-excited oscillator and adds a second noise to the oscillation signal; and
   a measuring unit that receives the oscillation signal including the sequentially accumulated first noises and the second noise, and calculates the first noise occurring at the location under measurement based on a difference between the received oscillation signal and a delayed signal obtained by delaying the received oscillation signal by a delay amount that is an integer multiple of an average period of the oscillation period.

2. The noise measurement apparatus according to claim 1, wherein the measuring unit includes:
   a delay circuit that receives the oscillation signal transmitted through the transmission path, after the oscillation signal is branched, and outputs a delayed signal obtained by delaying the received oscillation signal by a prescribed delay amount;
   a phase comparator that detects a phase difference between the oscillation signal transmitted by the transmission path and the delayed signal output by the delay circuit; and
   a noise calculating section that calculates the first noise based on the phase difference detected by the phase comparator.

3. The noise measurement apparatus according to claim 2, wherein the noise calculating section includes:
   a spectrum calculating section that calculates a frequency spectrum of the first noise, based on the phase difference detected by the phase comparator for each cycle of the oscillation signal;
   an extracting section that extracts, from the frequency spectrum, a frequency component that is less than a predetermined frequency; and
   a calculating section that calculates the first noise based on the component of the frequency spectrum extracted by the extracting section.

4. A noise measurement apparatus that measures noise distribution in a circuit substrate, comprising:
   a plurality of self-excited oscillators that are each provided at a different location under measurement in the circuit substrate, and that each output an oscillation signal in which is sequentially accumulated, in each oscillation period, a first noise occurring at the location under measurement;
   a transmission path that transmits the oscillation signal output by each self-excited oscillator and adds a second noise to each oscillation signal;
   a measuring unit that, for each oscillation signal, second noise receives the oscillation signal including the sequentially accumulated first noises and the second noise, and calculates the first noise occurring at the location under measurement based on a difference between the received oscillation signal and a delayed signal obtained by delaying the received oscillation signal by a delay amount that is an integer multiple of an average period of the oscillation period; and
   a distribution calculating section that calculates the noise distribution in the circuit substrate based on the first noise in each oscillation signal calculated by the measuring unit.

5. The noise measurement apparatus according to claim 4, wherein the transmission path includes a plurality of individual wirings that are provided to correspond one-to-one with the plurality of self-excited oscillators and that each transmit the oscillation signal output by the corresponding self-excited oscillator, and the noise measurement apparatus further comprises a selecting section that receives the oscillation signals transmitted through each of the plurality of individual wirings, sequentially selects the oscillation signals, and inputs the sequentially selected oscillation signals to the measuring unit.

6. The noise measurement apparatus according to claim 4, wherein the transmission path includes:
   a serial wiring that connects the plurality of self-excited oscillators in series with the measuring unit; and
   a plurality of individual switching sections that are provided to correspond one-to-one with the plurality of self-excited oscillators, and that each receive output of the self-excited oscillator at a previous stage and output of the corresponding self-excited oscillator, and switch which of the outputs is passed as output of the present stage, and the noise measurement apparatus further includes a selecting section that (i) sequentially selects one of the individual switching sections, (ii) causes the selected individual switching section to pass the output of the corresponding self-excited oscillator and causes the other individual switching sections to pass the output of the self-excited oscillator at the previous stage, thereby sequentially selecting each of the oscillation signals output by the self-excited oscillators, and (iii) inputs the selected oscillation signals to the measuring unit.

7. The noise measurement apparatus according to claim 5, wherein the measuring unit includes:
   a delay circuit that receives the oscillation signal input from the selecting section, after the oscillation signal is branched, and outputs a delayed signal obtained by delaying the received oscillation signal by a prescribed delay amount;

a phase comparator that detects a phase difference between the oscillation signal input from the selecting section and the delayed signal output by the delay circuit; and a noise calculating section that calculates the first noise at the location under measurement selected by the selecting section, based on the phase difference detected by the phase comparator.

8. The noise measurement apparatus according to claim 7, wherein the measuring unit further includes an adjusting section that adjusts the delay amount of the delay circuit based on the phase difference output by the phase comparator, such that a DC component of the phase difference output by the phase comparator becomes substantially zero.

9. The noise measurement apparatus according to claim 7, wherein the noise calculating section includes:

a spectrum calculating section that calculates a frequency spectrum of the first noise, based on the phase difference detected by the phase comparator for each cycle of the oscillation signal;

an extracting section that extracts, from the frequency spectrum, a frequency component that is less than a predetermined frequency; and a calculating section that calculates the first noise based on the component of the frequency spectrum extracted by the extracting section.

10. The noise measurement apparatus according to claim 5, further comprising a circuit control section that stops oscillation performed by self-excited oscillators other than the self-excited oscillator that is selected by the selecting section.

11. The noise measurement apparatus according to claim 4, wherein the circuit substrate includes a plurality of operation circuits, and each self-excited oscillator is provided at a location under measurement according to a corresponding operation circuit.

12. The noise measurement apparatus according to claim 11, wherein the circuit substrate further includes a power supply section that supplies the operation circuits with supply power, and the noise measurement apparatus further comprises a circuit control section that, when a 1/f noise component that is inversely proportional to frequency is among the first noise, causes the measuring unit to measure the combined first and second noise after stopping the power supply section and the operation circuits.

13. The noise measurement apparatus according to claim 11, wherein the circuit substrate further includes a power supply section that supplies the operation circuits with supply power, and the noise measurement apparatus further comprises a circuit control section that, when a noise component that is not dependent on frequency is among the first noise, causes the measuring unit to measure the combined first and second noise after causing the power supply section and the operation circuits to operate.

14. A noise measurement apparatus, comprising:

a transmission path that i) transmits an oscillation signal output by a self-excited oscillator provided at a location under measurement in the device under test, a first noise occurring at the location under measurement being sequentially accumulated in the oscillation signal in each oscillation period, and ii) adds a second noise to the oscillation signal; and a measuring unit that receives the oscillation signal including the sequentially accumulated first noises and the second noise, and calculates the first noise occurring at the location under measurement based on a difference between the received oscillation signal and a delayed signal obtained by delaying the received oscillation signal by a delay amount that is an integer multiple of an average period of the oscillation period.

* * * * *